United States Patent
Cowley et al.

(10) Patent No.: US 6,937,670 B2
(45) Date of Patent: Aug. 30, 2005

(54) DIGITAL TUNER

(75) Inventors: Nicholas Paul Cowley, Wroughton (GB); Alison Payne, London (GB); Mark Dawkins, London (GB)

(73) Assignee: Zarlink Semiconductor Limited (GB)

( * ) Notice: Subject to any disclaimer, the term of this patent is extended or adjusted under 35 U.S.C. 154(b) by 734 days.

(21) Appl. No.: 09/935,028

(22) Filed: Aug. 22, 2001

(65) Prior Publication Data

US 2002/0075971 A1 Jun. 20, 2002

(30) Foreign Application Priority Data

Aug. 22, 2000 (GB) ............................................... 0020527

(51) Int. Cl.[7] .......................... H04L 27/14; H04L 27/16; H04L 27/22
(52) U.S. Cl. ...................... 375/324; 375/325; 375/326; 375/327; 375/346; 375/316; 455/315; 348/725
(58) Field of Search ........................ 375/316, 324–327, 375/340, 350, 346; 455/315, 316; 348/725, 726, 731

(56) References Cited

U.S. PATENT DOCUMENTS

| | | | | |
|---|---|---|---|---|
| 5,038,404 A | * | 8/1991 | Marz | 455/118 |
| 5,390,346 A | * | 2/1995 | Marz | 455/260 |
| 5,852,477 A | * | 12/1998 | Limberg | 348/725 |
| 5,933,770 A | * | 8/1999 | Heiter | 455/307 |
| 5,999,572 A | | 12/1999 | Komatsu | |
| 6,057,876 A | * | 5/2000 | Waight | 725/151 |
| 6,680,977 B2 | * | 1/2004 | Collins et al. | 375/240.26 |
| 6,714,263 B2 | * | 3/2004 | Cowley | 348/731 |

FOREIGN PATENT DOCUMENTS

| | | |
|---|---|---|
| EP | 0431397 | 6/1991 |
| GB | 2091508 | 7/1982 |
| GB | 2192104 | 12/1987 |
| GB | 2316249 | 2/1998 |
| WO | WO 98/35544 | 8/1998 |
| WO | 98/38799 | 9/1998 |

* cited by examiner

*Primary Examiner*—Phuong Phu
(74) *Attorney, Agent, or Firm*—Thompson Hine LLP

(57) ABSTRACT

A digital tuner has an input tuning range with lower and upper limit frequencies. An up converter converts an input signal to an intermediate frequency signal whose frequency is higher than the upper frequency limit of the input range. A downconverter is a zero intermediate frequency quadrature converter which converts the intermediate frequency signal to in-phase and quadrature baseband signals. The upconverter has a local oscillator fundamental frequency which is greater than the upper frequency limit of the input tuning range.

7 Claims, 1 Drawing Sheet

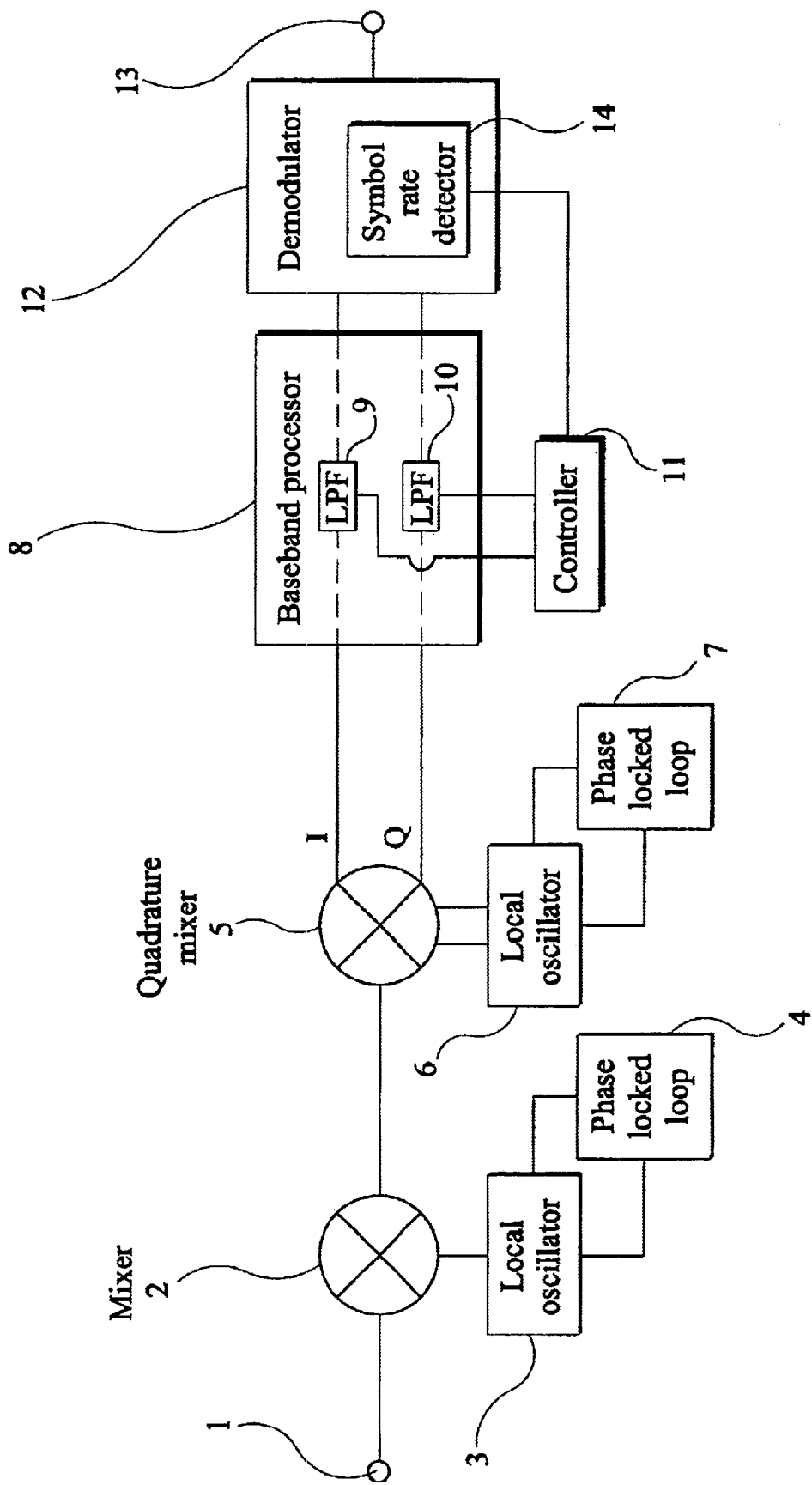

DIGITAL TUNER

FIELD OF THE INVENTION

The present invention relates to a digital tuner, for example for receiving cable or terrestrial signals over a wide tuning range.

BACKGROUND OF THE INVENTION

Known types of digital tuners are of single conversion or double conversion types. In the single conversion type, the incoming signal is converted to a fixed intermediate frequency (IF) which is sufficiently low for the received signals to be digitised and then demodulated in the digital domain. Double conversion tuners convert the incoming signal to a first intermediate frequency signal, which is then converted to a second intermediate frequency signal sufficiently low to permit digitisation and demodulation.

Another known type of tuner is of the direct conversion or zero IF type, in which the incoming signal is converted directly to the baseband signal in a single frequency conversion step and is then digitised and demodulated. Zero IF tuners are generally used where the tuning range of the tuner is narrow relative to the frequencies of the incoming signals. For example, in DBS (Direct Broadcast Satellite) systems, the tuning range or received frequency range is from 950 to 2150 MHz.

Zero IF tuners are not readily suitable for applications where the tuning range is relatively large compared with the received signal frequencies. For example, in a cable or terrestrial tuner, the tuning range is typically 50 to 900 MHz. When the tuner is tuned to one of the lower channels of such a large tuning range, there are a significant number of channels at harmonics of the tuned frequency. The mixer function within a zero IF tuner is generally highly non-linear so that there is the substantial risk of channels at frequencies which are integer multiples of the tuned frequency also being converted to the zero IF and hence of causing substantial interference, possibly rendering the technique unusable.

GB 2 316 249 discloses a digital radio receiver of the double conversion type comprising an input bandpass filter between the aerial input and the mixer of a first frequency changer of the upconverter type. The output of the first mixer is supplied via a bandpass filter at the first high intermediate frequency to the mixer of a second frequency changer of the downconverter type. The downconverter converts the high first intermediate frequency signals to a relatively low second intermediate frequency such that the selected signal has a bandwidth in the frequency range from 0 to 30 MHz. The second mixer is required to have high isolation characteristics in order to prevent breakthrough of the downconverter local oscillator signal to the input of the mixer of the upconverter. The frequencies of the local oscillators of the upconverter and downconverter are said to be outside the range of frequency of the broadcast signal.

GB 2 192 104 and WO 98/35544 disclose double conversion tuners in which the second frequency changer is of the quadrature type.

SUMMARY OF THE INVENTION

According to the invention, there is provided a digital tuner having an input tuning range with a lower frequency limit and an upper frequency limit, comprising an upconverter and a downconverter, characterised in that the upconverter is arranged to convert an input signal to an intermediate frequency signal whose frequency is higher than the upper frequency limit of the input tuning range and the downconverter is a zero intermediate frequency quadrature converter for converting the intermediate frequency signal to in-phase and quadrature baseband signals and in that the upconverter has a local oscillator fundamental frequency which is greater than the upper frequency limit of the input tuning range.

The upconverter may be a variable upconverter for selecting a desired channel and the downconverter may be a substantially fixed downconverter. As an alternative, the upconverter may be a substantially fixed upconverter and the downconverter may be a variable downconverter for selecting a desired channel.

The upconverter may be arranged to convert the input tuning range to an intermediate frequency range whose upper frequency limit is less than twice the lower frequency limit thereof.

There may be no frequency filtering between an input of the tuner and the input of the downconverter.

The tuner may comprise first and second baseband filters for filtering the in-phase and quadrature baseband signals from the downconverter. The first and second filters may be low pass filters. Each of the low pass filters may have a variable cut-off frequency controlled by a controller in accordance with the bandwidth of a received channel. The tuner may comprise a symbol rate detector for indicating the bandwidth of the received channel.

It is thus possible to provide a tuner which permits conversion to zero IF without substantially suffering from problems associated with channels at harmonic or integer multiple frequencies of the tuned channel or frequency. In particular, the up conversion may be performed such that the range of frequencies supplied to the downconverter is relatively small compared with the actual frequency. It is readily possible to perform the up conversion so that the upper limit of the frequency range is below the second harmonic of the lower limit of the frequency range so that no channels exist at any harmonic frequency of any tuned channel within the up-converted frequency range.

BRIEF DESCRIPTION OF THE DRAWINGS

The present invention will be further described, by way of example, with reference to the accompanying drawing, which illustrates a broad band digital tuner constituting an embodiment of the invention.

DETAILED DESCRIPTION

The tuner comprises an antennae input 1, which may be connected to a cable distribution system, to an aerial or aerial distribution system for terrestrial broadcast signals, or to a satellite dish via a head unit for converting the received frequency range to a lower frequency range. For example, in the case of cable or terrestrial signals, the received frequency range, and hence the required tuning range of the tuner, may typically be from 50 to 860 MHz.

The antennae input 1 is connected to an upconverter comprising a mixer 2, a local oscillator 3 and a phase locked loop 4. The upconverter 2-4 may be of the type which performs a fixed conversion such that the whole of the frequency range is up converted to a higher frequency range without selecting the desired channel. For example, for the above-mentioned typical tuning range of 50 to 860 MHz, the upconverter local oscillator frequency may be 1.05 GHz and the intermediate frequency bandwidth is then 1.1 to 1.96 GHz. Alternatively, the upconverter may be of the type which selects the desired channel for reception and converts this to a higher intermediate frequency. In this case, for the same tuning range, the upconverter local oscillator frequency may be tunable between 1.15 and 1.96 GHz to give an intermediate frequency centred on 1.1 GHz.

The output of the upconverter 2-4 is connected to a quadrature downconverter of the zero intermediate frequency type. The downconverter comprises a quadrature mixer 5, a local oscillator 6 supplying local oscillator signals in phase-quadrature to the mixer 5, and a phase locked loop 7. Where the upconverter 1 is of the fixed type, channel selection is performed in the downconverter and the oscillator 6 is a variable frequency local oscillator for selecting the desired channel to be down-converted. For the above example, the downconverter local oscillator frequency is tunable between 1.1 and 1.96 GHz.

Where the upconverter 1 is of the variable type and has a variable local oscillator as opposed to a fixed frequency local oscillator, the downconverter 5-7 is of the substantially fixed type and the oscillator 6 is a substantially fixed frequency local oscillator for converting the already-selected channel to zero IF or base band. For the above example, the downconverter local oscillator frequency is 1.1 GHz and may be tunable over a small range to allow compensation for any tuning inaccuracy, for example resulting from the discrete upconverter tuning step size.

The downconverter 5-7 supplies in-phase baseband signals and quadrature baseband signals Q to a baseband processor 8. The baseband processor performs various processing on the baseband I and Q signals including filtering as indicated by the variable low pass filters (LPF) 9 and 10. There is substantially no filtering between the input 1 and the filters 9 and 10 so that the upconverter 2-4 converts the whole of the input signal band to an intermediate frequency band of the same width and the downconverter 5-7 converts the whole of the intermediate frequency signal band down in frequency such that the selected channel is centred on zero frequency. The intermediate frequency band produced by the mixer 2 is such that it has an upper frequency limit which is less than twice its lower frequency limit, irrespective of the actual frequency of oscillation of the local oscillator 3. In the case of a fixed upconverter, the frequency of the local oscillator 3 is substantially fixed (or, as mentioned earlier, variable in a relatively small range) and is above the upper frequency limit of the input frequency band of the signals supplied from the input 1 to the mixer 2.

Where the upconverter 2-4 is of the variable type and performs most or all of the channel selection, the frequency range of the local oscillator 3 is such that the frequency of oscillation is always greater than the upper frequency limit of the input signal frequency band. Further, the frequencies are chosen such that the intermediate frequency range of signals appearing at the output of the mixer 2 always has an upper frequency limit which is less than twice its lower frequency limit, irrespective of the actual frequency of the local oscillator 3 for selecting the desired channel for reception. The frequency of the local oscillator 6 is equal to the centre frequency of the desired channel after upconversion by the upconverter 2-4. The local oscillator frequency of the zero intermediate frequency downconverter 5-7 is therefore always above the upper frequency limit of the input frequency range supplied to the input of the mixer 2 and, moreover, is such that there is no channel at harmonics of the local oscillator frequency above the fundamental frequency thereof.

The tuner therefore overcomes the problems mentioned hereinbefore with regard to zero intermediate frequency tuners for large input tuning or frequency ranges. In particular, because there are no channels at harmonics of the local oscillator fundamental frequency, there is no contamination of the downconverter output signals I and Q from the mechanism described hereinbefore.

As mentioned hereinbefore, there is no band filtering until the low pass filters 9 and 10 in the baseband processor 8. Because the signals I and Q from the mixer 5 are baseband signals, channel filtering can be performed by low pass filters and does not require bandpass filters. Different channels may have different bandwidths and the low pass filters 9 and 10 thus have a variable cut-off frequency controlled by a controller 11 so that the effective pass band (around zero frequency) can be controlled in accordance with the bandwidth of the received channel. The cut-off frequencies of the filters 9 and 10 are generally equal to each other and are controlled by the controller 11.

The baseband processor 8 performs other functions on the baseband signals I and Q, for example including analog/digital conversion. Although the filtering provided by the filters 9 and 10 may be before or after such analog/digital conversion, it will generally be necessary or desirable for at least part of the filtering to be performed in the analogue domain before the converters, for example so as to avoid aliasing.

The outputs of the processor 8 are supplied to a demodulator 12 which demodulates the received channel in accordance with its modulation type and supplies output signals at a tuner output 13. The demodulator 12 performs various functions in addition to demodulation in accordance with the modulation standard and, in the embodiment shown in the drawing, includes a symbol rate detector 14 which detects the symbol rate of the received channel to allow the bandwidth of the received channel to be determined. The symbol rate is supplied to the controller 11 which adjusts the cut-off frequencies of the filters 9 and 10 in accordance with the channel bandwidth.

It is thus possible to ensure that the zero IF downconversion can be achieved, even when this downconversion is performed by a mixer of highly non-linear type. In particular, by appropriately selecting the up-conversion and hence the intermediate frequency presented to the downconverter 3 relative to the tuning range, it can be ensured that, for every channel within the tuning range, there are no channels at harmonics or integer multiple frequencies. Thus, a major source of interference in zero IF down-conversion can be eliminated or substantially reduced so as to make the technique viable.

What is claimed is:

1. A digital tuner having an input tuning range with a lower frequency limit and an upper frequency limit, said tuner comprising:

an upconverter for converting an input signal to an intermediate frequency signal whose frequency is higher than said upper frequency limit of said input tuning range, said upconverter having a local oscillator fundamental frequency which is greater than said upper frequency limit of said input tuning range; and a zero intermediate frequency quandrature downconverter for converting said intermediate frqeuency signal from said upconverter to in-phase and quadrature baseband signals;

wherein said upconverter is a substantially fixed upconverter and said downconverter is a variable downconverter for selecting a desired channel.

2. A tuner as claimed in claim 1, in which said upconverter is arranged to convert said input tuning range to an intermediate frequency range having a lower frequency limit and an upper frequency limit less than twice said lower frequency limit of said intermediate frequency range.

3. A tuner as claimed in claim 1, in which said tuner has an input, said downconverter has an input, and there is no frequency filtering between said input of said tuner and said input of said downconverter.

4. A tuner as claimed in claim 1, comprising first and second baseband filters for filtering said in-phase and quadrature baseband signals from said downconverter.

5. A tuner as claimed in claim 4, in which said first and second filters are low pass filters.

6. A tuner as claimed in claim 5, in which each of said low pass filters has a variable cut-off frequency, said tuner comprising a controller for controlling said variable cut-off frequency in accordance with a bandwidth of a received channel.

7. A tuner as claimed in claim 6, comprising a symbol rate detector for indicating said bandwidth of said received channel to said controller.

* * * * *